United States Patent
Otomi et al.

(10) Patent No.: US 12,402,248 B2
(45) Date of Patent: Aug. 26, 2025

(54) WIRING SUBSTRATE

(71) Applicant: IBIDEN CO., LTD., Gifu (JP)

(72) Inventors: Kiyoteru Otomi, Ogaki (JP); Katsutoshi Ito, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 86 days.

(21) Appl. No.: 18/161,926

(22) Filed: Jan. 31, 2023

(65) Prior Publication Data

US 2023/0284380 A1    Sep. 7, 2023

(30) Foreign Application Priority Data

Jan. 31, 2022   (JP) ................. 2022-013532

(51) Int. Cl.
| | |
|---|---|
| *H05K 1/02* | (2006.01) |
| *H05K 1/11* | (2006.01) |
| *H05K 3/00* | (2006.01) |
| *H05K 3/46* | (2006.01) |
| *H05K 3/42* | (2006.01) |

(52) U.S. Cl.
CPC ......... *H05K 1/0298* (2013.01); *H05K 1/0271* (2013.01); *H05K 3/0094* (2013.01); *H05K 3/4644* (2013.01); *H05K 1/111* (2013.01); *H05K 1/112* (2013.01); *H05K 1/115* (2013.01); *H05K 3/0038* (2013.01); *H05K 3/429* (2013.01); *H05K 2201/0959* (2013.01); *H05K 2203/072* (2013.01); *H05K 2203/0723* (2013.01)

(58) Field of Classification Search
CPC .. H05K 1/0298; H05K 1/0271; H05K 3/0094; H05K 3/4644; H05K 3/0038; H05K 3/429; H05K 2201/0959; H05K 2203/072; H05K 2203/0723; H05K 2201/0347; H05K 3/4602; H05K 1/11; H05K 3/4608; H05K 3/4614
See application file for complete search history.

(56) References Cited

U.S. PATENT DOCUMENTS

| | | | |
|---|---|---|---|
| 2018/0061765 A1* | 3/2018 | Gozu | H01L 21/4857 |
| 2018/0166372 A1* | 6/2018 | Shimizu | H05K 3/4644 |
| 2018/0184521 A1* | 6/2018 | Kitajo | H05K 3/4602 |

FOREIGN PATENT DOCUMENTS

JP    2005-203764    7/2005

* cited by examiner

*Primary Examiner* — Ishwarbhai B Patel
(74) *Attorney, Agent, or Firm* — Finnegan, Henderson, Farabow, Garrett & Dunner, LLP (57) ABSTRACT

A wiring substrate includes a core substrate including a core insulating layer, a first conductor layer, a second conductor layer, a first insulating layer, a second insulating layer, a third conductor layer, and a fourth conductor layer. The first conductor layer includes first land and first plane parts, the second conductor layer includes second land and second plane parts, the third conductor layer includes fine wirings and a third plane part, the fourth conductor layer includes fine wirings and a fourth plane part, the substrate includes a through-hole conductor connecting the first and second land parts through the core insulating layer, a first via conductor connecting the first land part and third conductor layer, a second via conductor connecting the second land part and fourth conductor layer, a third via conductor connecting the first and third plane parts, and a fourth via conductor connecting the second and fourth plane parts.

20 Claims, 6 Drawing Sheets

WIRING SUBSTRATE

CROSS-REFERENCE TO RELATED APPLICATIONS

The present application is based upon and claims the benefit of priority to Japanese Patent Application No. 2022-013532, filed Jan. 31, 2022, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2005-203764 describes a multi-layer wiring substrate including a core substrate having a through hole part. Japanese Patent Application Laid-Open Publication No. 2005-203764. The entire contents of this publication are incorporated herein by reference.

SUMMARY OF THE INVENTION

According to one aspect of the present invention, a wiring substrate includes a core substrate including a core insulating layer, a first conductor layer formed on a first surface of the core insulating layer, a second conductor layer formed on a second surface of the core insulating layer on the opposite side with respect to the first surface, a first insulating layer formed on the first surface of the core insulating layer such that the first insulating layer is covering the first conductor layer, a second insulating layer formed on the second surface of the core insulating layer such that the second insulating layer is covering the second conductor layer, a third conductor layer formed on the first insulating layer, and a fourth conductor layer formed on the second insulating layer. The first conductor layer includes a first land part and a first plane part, the second conductor layer includes a second land part and a second plane part, the third conductor layer includes fine wirings and a third plane part such that the first and third plane parts are substantially overlapping with each other and have substantially the same size, the fourth conductor layer includes fine wirings and a fourth plane part such that the second and fourth plane parts are substantially overlapping with each other and have substantially the same size, the core substrate includes a through-hole conductor formed through the core insulating layer and connecting the first land part and the second land part, a first via conductor formed through the first insulating layer and connecting the first land part and the third conductor layer, a second via conductor formed through the second insulating layer and connecting the second land part and the fourth conductor layer, a third via conductor formed through the first insulating layer and connecting the first plane part and the third plane part, and a fourth via conductor formed through the second insulating layer and connecting the second plane part and the fourth plane part.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
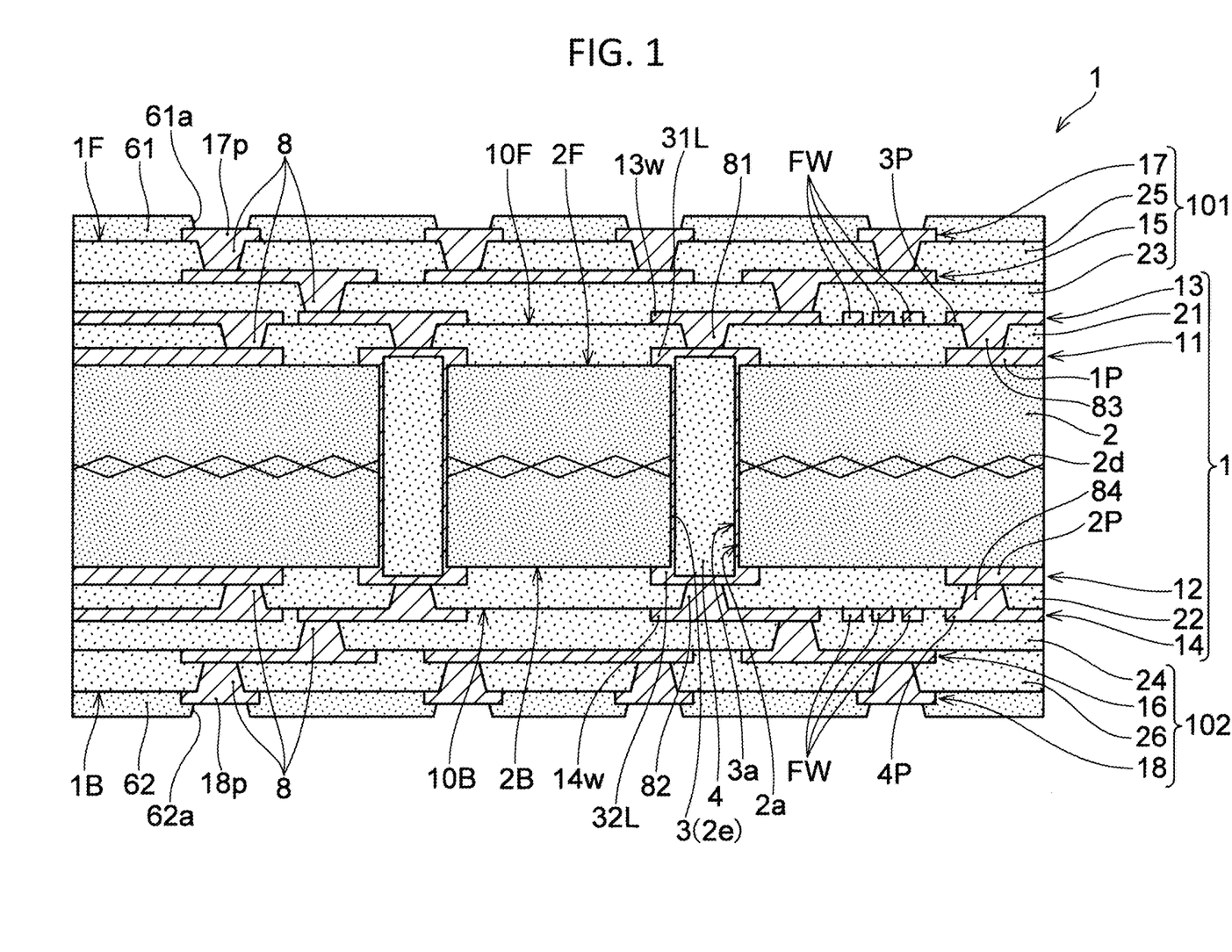
FIG. 1 is a cross-sectional view illustrating an example of a wiring substrate according to an embodiment of the present invention.

The drawings to be referenced below are drawn such that features according to embodiments of the present invention are easily understood, without intending to show exact proportions of structural elements. FIG. 1 illustrates a cross-sectional view of a structure of a wiring substrate 1 as an example according to an embodiment of the present invention.

As illustrated in FIG. 1, a wiring substrate 1 has a core substrate 10 having a first surface (10F) and a second surface (10B) on an opposite side with respect to the first surface (10F). The core substrate 10 includes a core insulating layer 2, and two conductor layers (a first conductor layer 11 and a second conductor layer 12) that are respectively formed on two main surfaces (a first surface (2F) on the first surface (10F) side and a second surface (2B) on the second surface (10B) side) of the core insulating layer 2 that oppose each other in a thickness direction of the core insulating layer 2. A first insulating layer 21 is formed on the first conductor layer 11 and on the first surface (2F) exposed from conductor patterns of the first conductor layer 11, and a third conductor layer 13 is formed on the first insulating layer 21. The first surface (10F) of the core substrate 10 is formed by an upper surface of the third conductor layer 13 and an upper surface of the first insulating layer 21 exposed from conductor patterns of the third conductor layer 13. A second insulating layer 22 is formed on the second conductor layer 12 and on the second surface (2B) exposed from conductor patterns of the second conductor layer 12, and a fourth conductor layer 14 is formed on the second insulating layer 22. The second surface (10B) of the core substrate 10 is formed by an upper surface of the fourth conductor layer 14 and an upper surface of the second insulating layer 22 exposed from conductor patterns of the fourth conductor layer 14. The core insulating layer 2 includes through-hole conductors 3 that penetrate the core insulating layer 2 in the thickness direction and connect the first conductor layer 11 and the second conductor layer 12.

Build-up parts (a first build-up part 101 and a second build-up part 102), which are each formed by alternately laminating insulating layers and conductor layers, are respectively formed on the first surface (10F) and the second surface (10B) of the core substrate 10. In the wiring substrate 1, on the first surface (10F) of the core substrate 10, a third insulating layer 23, a fifth conductor layer 15, a fifth insulating layer 25, and a seventh conductor layer 17 are laminated in this order from the first surface (10F) side. On the other hand, on the second surface (10B) of the core substrate 10, a fourth insulating layer 24, a sixth conductor layer 16, a sixth insulating layer 26, and an eighth conductor layer 18 are laminated in this order from the second surface (10B) side.

The wiring substrate 1 illustrated in FIG. 1 is formed of the core substrate 10, the first build-up part 101, and the second build-up part 102. A surface formed by the fifth insulating layer 25 and the seventh conductor layer 17 forms a first surface (1F) of the wiring substrate 1. Further, a surface formed by the sixth insulating layer 26 and the eighth conductor layer 18 forms a second surface (1B) of the wiring substrate 1.

In the description of the embodiment, a side farther from the core insulating layer 2 in the thickness direction of the wiring substrate 1 is also referred to as an "upper side," "outer side," or simply "upper," and a side closer to the core insulating layer 2 is also referred to as a "lower side," "inner side," or simply "lower." Further, for the conductor layers and the interlayer insulating layers, a surface facing an opposite side with respect to the core insulating layer 2 is also referred to as an "upper surface," and a surface facing the core insulating layer 2 side is also referred to as a "lower surface."

The through-hole conductors 3 are respectively formed in through holes (2a) of the core insulating layer 2 to have a predetermined thickness on inner walls of the through holes (2a) without completely filling through holes (2a). That is, the through-hole conductors 3 respectively have hollow spaces (3a) penetrating the through-hole conductors 3 in the thickness direction of the core insulating layer 2, and as a whole have tubular shapes along the inner walls of the through holes (2a). The through-hole conductors 3 may be formed of, for example, a metal film.

Preferably, the hollow spaces (3a) are substantially completely filled with a resin 4. The resin 4 is not particularly limited as long as the resin 4 fills the hollow spaces (3a). The resin 4 may be non-conductive or conductive. The resin 4 may be, for example, an insulating resin such as an epoxy resin, an acrylic resin, or a phenol resin, or a conductive paste or conductive ink containing conductive particles such as silver particles, an epoxy resin, and the like. As the resin 4, a resin or the like having a thermal expansion coefficient close to that of the core insulating layer 2 may be selected. It may be possible that a thermal stress generated in the core insulating layer 2 is reduced.

The core insulating layer 2 and the insulating layers (21-26) are each formed of any insulating resin. An example of the insulating resin is a thermosetting resin such as an epoxy resin, a bismaleimide triazine resin (BT resin), or a phenol resin. The insulating layers each may further contain an inorganic filler (not illustrated in the drawings) formed of fine particles of silica (SiO2), alumina, mullite, or the like, and/or a reinforcing material (core material) formed of a glass fiber, an aramid fiber, or the like. In the example of FIG. 1, the core insulating layer 2 contains a core material (reinforcing material) (2d). The other insulating layers (21-26) do not contain a core material.

In each of the insulating layers (21-26), via conductors 8 penetrating the each of the insulating layers are formed. The via conductors 8 are connection conductors that connect conductor layers that are adjacent to each other in the thickness direction via the each of the insulating layers.

The first conductor layer 11 of the core substrate 10 has first land parts (31L) that are integrally formed with the through-hole conductors 3. The first land parts (31L) are connected to the third conductor layer 13 via first via conductors 81 penetrating the first insulating layer 21. The second conductor layer 12 of the core substrate 10 has second land parts (32L) that are integrally formed with the through-hole conductors 3. The second land parts (32L) are connected to the fourth conductor layer 14 via second via conductors 82 penetrating the second insulating layer 22.

In the example of FIG. 1, a solder resist layer 61 is formed on the first build-up part 101. A solder resist layer 62 is formed on the second build-up part 102. Openings (61a) are formed in the solder resist layer 61, and conductor pads (17p) of the outermost seventh conductor layer 17 of the first build-up part 101 are exposed from the openings (61a). Openings (62a) are formed in the solder resist layer 62, and conductor pads (18p) of the outermost eighth conductor layer 18 of the second build-up part 102 are exposed from the openings (62a). The solder resist layers (61, 62) are each formed using, for example, a photosensitive epoxy resin or polyimide resin, or the like.

The conductor pads (17p) are formed, for example, such that a component (not illustrated in the drawings) to be mounted on the wiring substrate 1 when the wiring substrate 1 is used is placed thereon. That is, the conductor pads (17p) are component mounting pads to be used as connecting parts when an external component is mounted on the wiring substrate 1, and the first surface (1F) of the wiring substrate 1 can be a component mounting surface.

The second surface (1B) of the wiring substrate 1 can be a connecting surface to be connected to an external wiring substrate, for example, an external element such as a motherboard of any electrical device, when the wiring substrate 1 itself is mounted on the external element. Further, similar to the first surface (1F), the second surface (1B) may be a component mounting surface on which an electronic component such as a semiconductor integrated circuit device is mounted. Without being limited to these, the conductor pads (18p) forming the second surface (1B) can be connected to any substrate, electrical component, mechanism element, or the like.

A protective film (not illustrated in the drawings) may be formed on exposed surfaces of the conductor pads (17p, 18p). For example, the protective film formed of Ni/Au, Ni/Pd/Au, Sn or the like may be formed by plating. An OSP film may be formed by spraying an organic material.

The conductor layers (11-18), the via conductors 8 including the first via conductors 81 and the second via conductors 82, and the through-hole conductors 3 may be formed using any metal such as copper or nickel. The conductor layers (11-18), the via conductors 8, and the through-hole conductors 3 are simplified for clarity and illustrated as each having a single-layer structure in FIG. 1, but may each have a multilayer structure that includes two or more layers.

In the example of FIG. 1, the through-hole conductors 3 are formed by a first plating film (2e) on the inner walls of the through holes (2a) so as to cover the inner walls. That is, the first plating film (2e) is formed in a tubular shape with the thickness direction of the core insulating layer 2 as an axial direction thereof. The first plating film (2e) may be formed of, for example, an electroless plating film (2e1) formed on the inner walls of the through holes (2a), and an electrolytic plating film (2e2) formed using the electroless plating film as a power feeding layer on an inner side of the electroless plating film in the through holes (2a) so as to cover the electroless plating film (see FIG. 3B). However, the through-hole conductors 3 may be formed of a plating film of any number of layers equal to or larger than one. As described above, in FIG. 1, the first plating film (2e) is illustrated as a single-layer metal film.

The first conductor layer 11 and the second conductor layer 12 each include a metal foil (2c) (which is, for example, a copper foil) laminated on the first surface (2F) or the second surface (2B) of the core insulating layer 2, a first plating film (2e) on the metal foil (2c), and a second plating film (2f) on the first plating film (2e). Similar to the first plating film (2e), the second plating film (2f) may be formed of an electroless plating film and an electrolytic plating film formed on the electroless plating film by electrolytic plating using the electroless plating film as a power feeding layer. Therefore, the first conductor layer 11 and the second conductor layer 12 each have a five-layer structure Including a metal foil (2c), a metal film layer (2e1) (which is an electroless plating film), an electrolytic plating film layer (2e2), a metal film layer (2f1) (which is an electroless plating film), and an electrolytic plating film layer (2f2) (see FIG. 3D).

The metal foil (2c) may be formed of any metal, and is, for example, a foil body such as a copper foil or a nickel foil. The metal foil (2c) is, for example, a copper foil bonded to the core insulating layer 2 by thermocompression. The first plating film (2e) and the second plating film (2f) are formed, for example, using any metal such as copper or nickel. The first plating film (2e) and the second plating film (2f) may each include a metal film such as a sputtering film formed by sputtering instead of an electroless plating film.

The third conductor layer 13, the fourth conductor layer 14, the fifth conductor layer 15, the sixth conductor layer 16, the seventh conductor layer 17, the eighth conductor layer 18, and the via conductors 8 each have, for example, a two-layer structure including a metal film formed by electroless plating or sputtering, and a plating film formed on the metal film by electrolytic plating using the metal film as a power feeding layer.

Each of the via conductors 8 is integrally formed with a conductor layer on an upper side thereof. For example, the first via conductors 81 are integrally formed with the third conductor layer 13. The second via conductors 82 are integrally formed with the fourth conductor layer 14.

The conductor layers (11-18) may each include any conductor patterns. As described above, the first conductor layer 11 and the second conductor layer 12 formed on the core insulating layer 2 include land parts (the first land parts (31L) and the second land parts (32L), respectively) integrally formed with the through-hole conductors 3. As illustrated in FIG. 1, the third conductor layer 13, which is the outermost conductor layer of the core substrate 10 that forms the first surface (10F) of the core substrate 10, includes conductor patterns (13w) that are connected to the first land parts (31L) via the first via conductors 81, fine wirings (FW), and plane parts (third plane parts) (3P) adjacent to the fine wirings (FW). The fourth conductor layer 14, which is the other outermost conductor layer of the core substrate 10 that forms the second surface (10B) of the core substrate 10, includes conductor patterns (14w) that are connected to the second land parts (32L) via the second via conductors 82, fine wirings (FW), and plane parts (fourth plane parts) (4P) adjacent to the fine wirings (FW).

Here, a plane part can mean a so-called solid pattern extending over a predetermined region in a planar direction perpendicular to the thickness direction of the core substrate 10.

As described above, the first conductor layer 11 and the second conductor layer 12 that are respectively formed on the first surface (2F) and the second surface (2B) of the core insulating layer 2 may each have a five-layer structure. On the other hand, the third conductor layer 13 and the fourth conductor layer 14 that respectively form the outermost layers of the core substrate 10 may each have a two-layer structure. Therefore, in the third conductor layer 13 and the fourth conductor layer 14, the fine wirings (FW), which are finer wiring patterns than conductor patterns that are formed in the first conductor layer 11 and the second conductor layer 12, are formed. In the embodiment, the "fine wirings" are wiring patterns having smallest wiring widths and smallest inter-wiring distances between closest wirings in the wiring substrate of the embodiment.

For example, the fine wirings (FW) have a line width of 8 μm or more and 30 μm or less, and an inter-wiring distance of 10 μm or more and 30 μm or less. An aspect ratio of the fine wirings (FW) may be larger than aspect ratios of other wirings included in the third conductor layer 13 and the fourth conductor layer 14 and/or wirings included in the other conductor layers. For example, the aspect ratio of the fine wirings (FW) may be 2.0 or more and 6.0 or less. On the other hand, for example, the aspect ratios of the other wirings included in the third conductor layer 13 and the fourth conductor layer 14 and/or the wirings included in the other conductor layers may be, for example, 1.0 or more and 2.0 or less.

The fine wirings (FW) can be wirings for signal transmission, and the signals may be high frequency signals. When such wirings for signal transmission or the like are formed in the outermost conductor layers of the core substrate 10, finer wirings may be formed by forming the wirings in the conductor layers (the third conductor layer 13 and the fourth conductor layer 14) formed on surfaces of the insulating layers (the first insulating layer 21 and the second insulating layer 22) formed on the core insulating layer 2, rather than forming the wirings in the conductor layers (the first conductor layer 11 and the second conductor layer 12) formed on the surfaces of the core insulating layer 2.

In the example illustrated in FIG. 1, the first conductor layer 11 includes first plane parts (1P) in addition to the first land parts (31L). The first plane parts (1P) are formed in regions directly below the third plane parts (3P) of the third conductor layer 13, that is, at positions that substantially match the third plane parts (3P) in a plan view, and have substantially the same sizes as the third plane parts (3P). The term "plan view" means viewing the wiring substrate of the embodiment along the thickness direction thereof. Further, in the example of FIG. 1, the second conductor layer 12 includes second plane parts (2P) in addition to the second land parts (32L). The second plane parts (2P) are formed in regions directly below the fourth plane parts (4P) of the fourth conductor layer 14, that is, at positions that substantially match the fourth plane parts (4P) in a plan view, and have substantially the same size as the fourth plane parts (4P). Preferably, the first conductor layer 11 does not include conductor patterns other than the first land parts (31L) and the first plane parts (1P). Preferably, the second conductor layer 12 does not include conductor patterns other than the second land parts (32L) and the second plane parts (2P).

By having this structure in which the first conductor layer 11 formed on one surface of the core insulating layer 2 has the first plane parts (1P) and the second conductor layer 12 formed on the other surface of the core insulating layer 2 has the second plane parts (2P), it is thought that warping of the core substrate 10 is suppressed. Further, it is thought that variation in deformation such as expansion and contraction or distortion that can occur during a manufacturing process of the wiring substrate 1 is reduced.

The first plane parts (1P) and the third plane parts (3P) that overlap in a plan view are connected by the third via conductors 83. The second plane parts (2P) and the fourth plane parts (4P) that overlap in a plan view are connected by the fourth via conductors 84. By being connected by the via conductors, the first plane parts (1P) and the third plane parts (3P), and, the second plane parts (2P) and the fourth plane parts (4P), form plane parts each spanning two layers. When these are used for ground or power supply, it is thought that a ground level or a power supply level is unlikely to fluctuate.

In the example illustrated in FIG. 1, in the third conductor layer 13, the fine wirings (FW) of the third conductor layer 13 are sandwiched between a conductor pattern (13w), which is connected to a first land parts (31L) via a first via conductor 81, and a third plane part (3P) in a direction orthogonal to an extension direction of the fine wirings (FW). Further, in the fourth conductor layer 14, the fine wirings (FW) of the fourth conductor layer 14 are sandwiched between a conductor pattern (14w), which is connected to a second land part (32L) via a second via conductor 82, and a fourth plane part (4P) in a direction orthogonal to an extension direction of the fine wirings (FW). It is thought that a core substrate is provided in which signal lines are formed on outer layers, allowing transmission with less noise.

Figure 2:
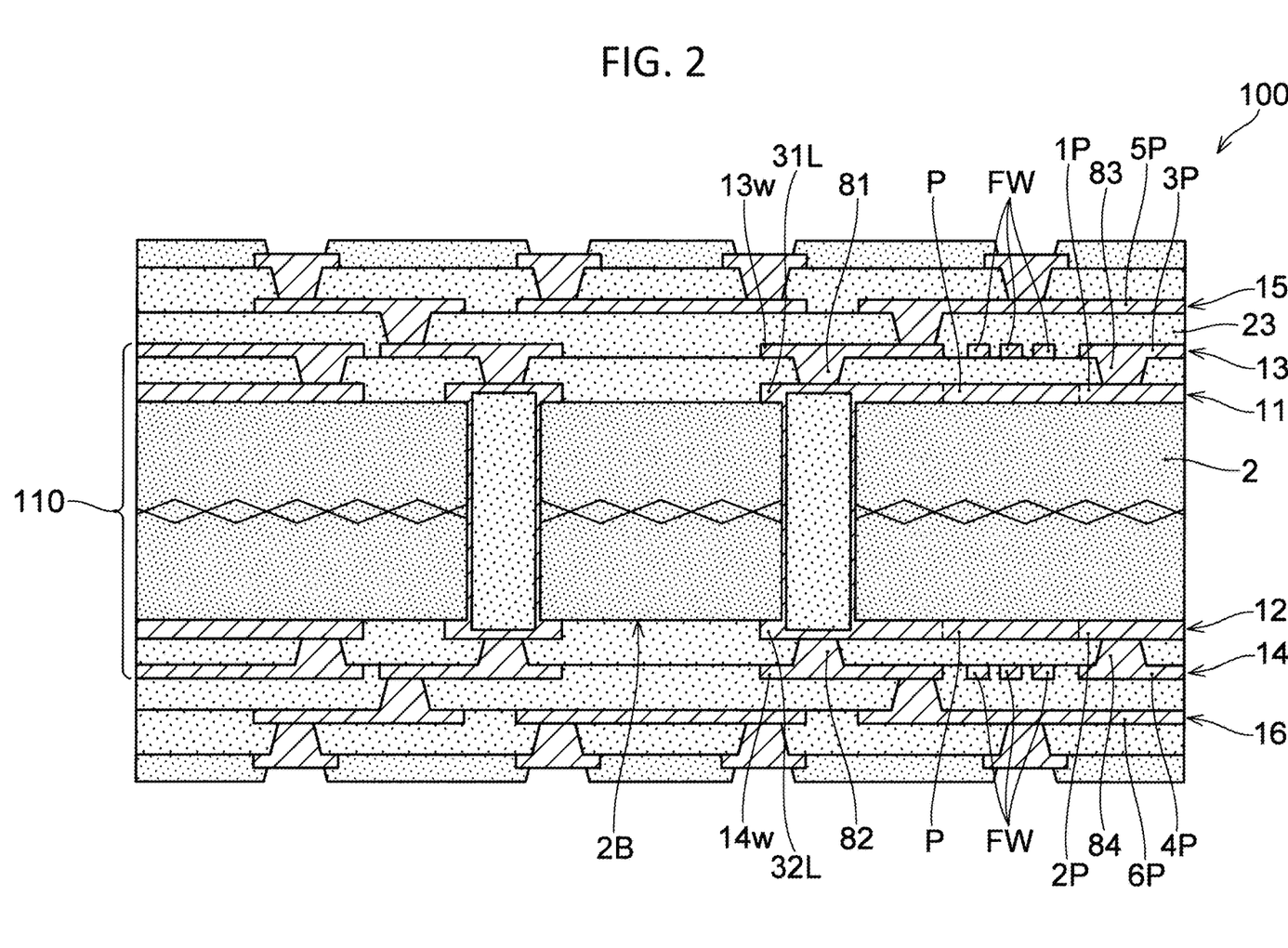
FIG. 2 is a cross-sectional view illustrating another example of a wiring substrate according to an embodiment of the present invention.

The wiring substrate of the embodiment may have a structure in which the fine wirings (FW) are surrounded by plane parts as in a wiring substrate 100 illustrated in FIG. 2. In the wiring substrate 100, a plane part (fifth plane part) (5P) included in the fifth conductor layer 15 is formed in a region directly above the fine wirings (FW) of the third conductor layer 13 with the third insulating layer 23 interposed therebetween. In the example of FIG. 2, the fifth plane part (5P) is connected to a conductor pattern (13w) of the third conductor layer 13, which is connected to a first land part (31L) via a first via conductor 81.

In a core substrate 110 included in the wiring substrate 100, a connection plane part (P) connecting the first land part (31L) and a first plane part (1P) is formed in the first conductor layer 11. That is, the first conductor layer 11 of the core substrate 110 includes a plane part that is integrated with the first land part (31L) and has a larger area. The plane part integrated with the first land part (31L) is formed in a region directly below the fine wirings (FW) of the third conductor layer 13. A third plane part (3P) is connected to the first land part (31L) via a third via conductor 83. That is, in the wiring substrate 100, the fine wirings (FW) of the third conductor layer 13 are sandwiched between the conductor pattern (13w) and the third plane part (3P), both of which are connected to the first land part (31L), in a direction orthogonal to an extension direction of the fine wirings (FW). And, the fine wirings (FW) of the third conductor layer 13 are sandwiched between the plane parts (1P, P), both of which are connected to the first land part (31L), and the plane part (5P), positioned directly above and below the fine wirings, that is, in a thickness direction of the wiring substrate 100. It is thought that characteristics of signals transmitted via the fine wirings (FW) are more stable. It is thought that excellent signal transmission quality is obtained.

In wiring substrate 100, also on the second surface (2B) side of the core insulating layer 2, a sixth plane part (6P) is formed in the sixth conductor layer 16 in a region directly above the fine wirings (FW) included in the fourth conductor layer 14. The sixth plane part (6P) is connected to a conductor pattern (14w) of the fourth conductor layer 14, which is connected to a second land part (32L) via a second via conductor 82. A connection plane part (P) connecting the second land part (32L) and a second plane part (2P) is formed in the second conductor layer 12 in a region directly below the fine wirings (FW). A fourth plane part (4P) is connected to the second land part (32L) via a fourth via conductor 84. The fine wirings (FW) of the fourth conductor layer 14 are sandwiched between the conductor pattern (14w) and the fourth plane part (4P), both of which are connected to the second land part (32L), in a direction orthogonal to an extension direction of the fine wirings (FW). And, the fine wirings (FW) of the fourth conductor layer 14 are sandwiched between the plane parts (2P, P), both of which are connected to the second land part (32L), and the plane part (6P), positioned directly above and below the fine wirings, that is, in the thickness direction of the wiring substrate 100.

With reference to FIGS. 3A-3I, a manufacturing method is described using a case where the wiring substrate 1 illustrated in FIG. 1 is manufactured as an example. Structural elements formed in the manufacturing method to be described below may be formed using the materials exemplified as the materials of the corresponding structural elements in the description of the wiring substrate 1 in FIG. 1, unless otherwise specified.

Figure 3A:
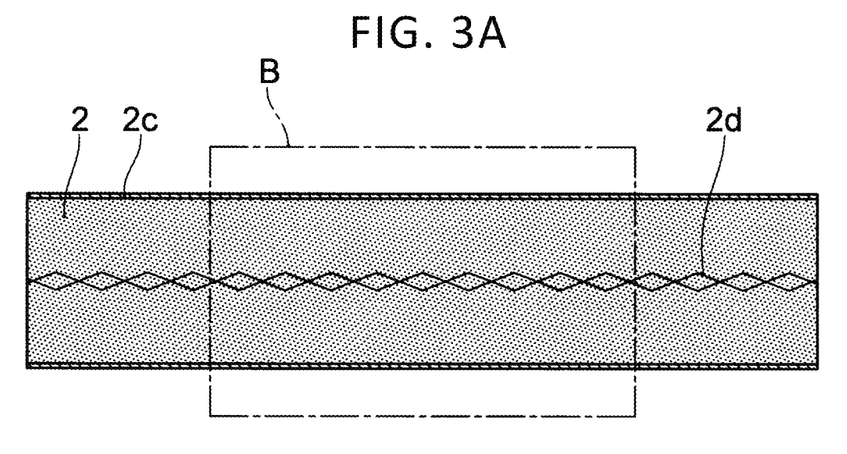
FIG. 3A is a cross-sectional view illustrating a method for manufacturing a wiring substrate according to an embodiment of the present invention.
Figure 3B:
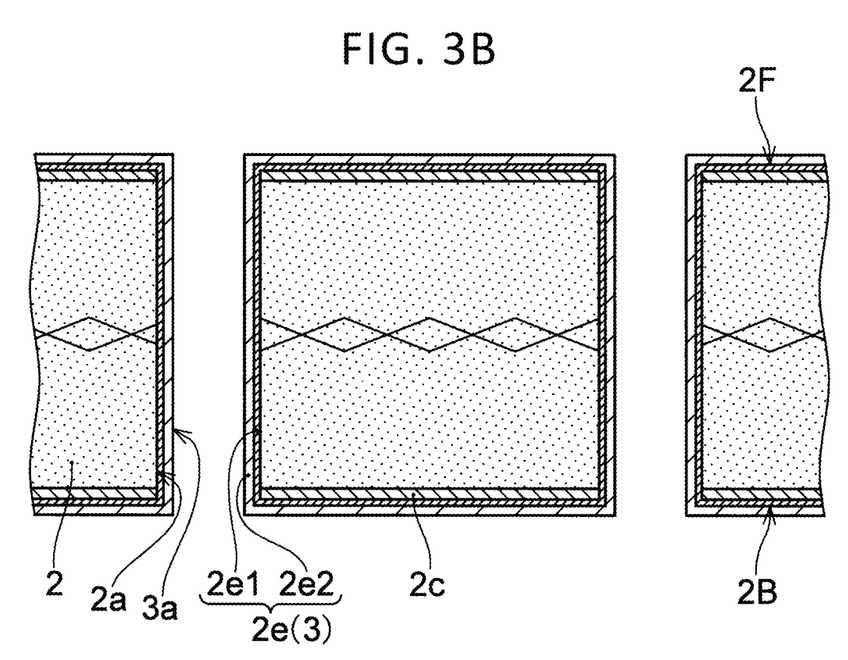
FIG. 3B is a cross-sectional view illustrating a method for manufacturing a method for manufacturing a wiring substrate according to an embodiment of the present invention.
Figure 3C:
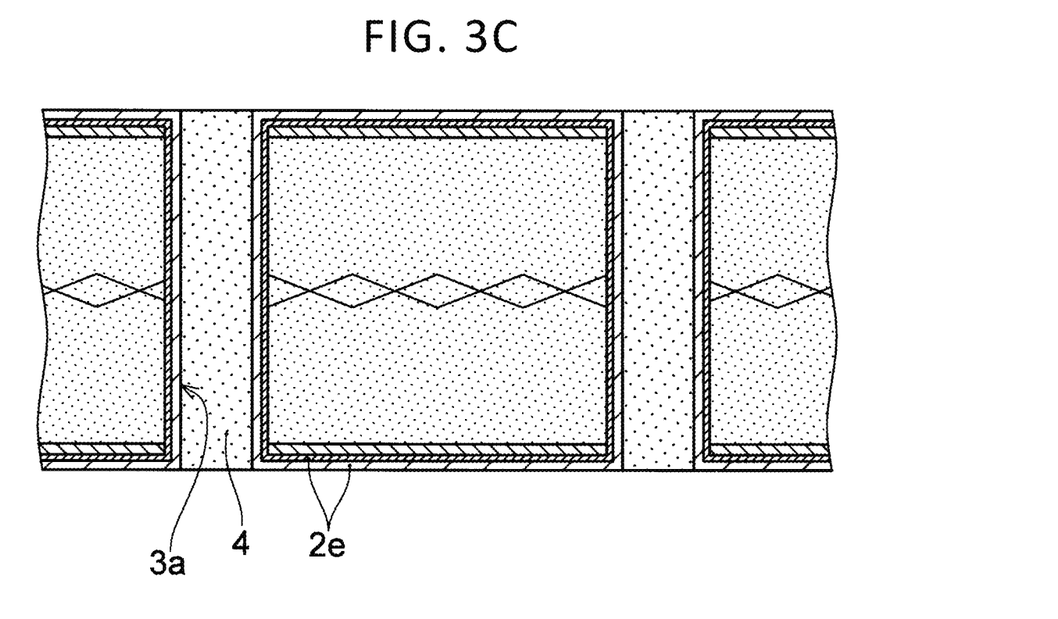
FIG. 3C is a cross-sectional view illustrating a method for manufacturing a method for manufacturing a wiring substrate according to an embodiment of the present invention.
Figure 3D:
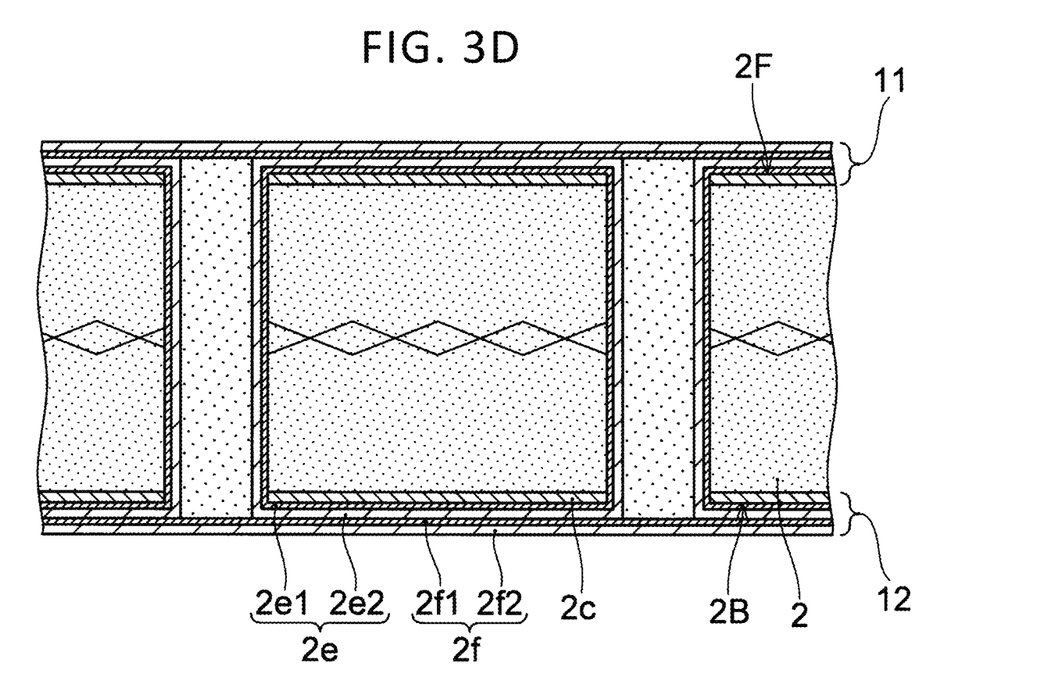
FIG. 3D is a cross-sectional view illustrating a method for manufacturing a method for manufacturing a wiring substrate according to an embodiment of the present invention.

First, a substrate (starting substrate) including the core insulating layer 2 and the metal foil (2c) laminated on both sides of the core insulating layer 2 is prepared. The core insulating layer 2 is formed of, for example, any insulating resin such as epoxy resin, a BT resin, or a phenol resin. As illustrated in FIG. 3A, the core insulating layer 2 contains the core material (2d). However, it is also possible that the core insulating layer 2 does not contain the core material (2d). The metal foil (2c) is formed of, for example, any metal such as copper or nickel. The metal foil (2c) is bonded to both sides of the core insulating layer 2 using any method such as thermocompression bonding. For example, a double-sided copper-clad laminated plate may be prepared as the starting substrate. FIGS. 3B-3D below each illustrate an enlarged view of a region (B) surrounded by a one-dot chain line in FIG. 3A.

As illustrated in FIG. 3B, the through holes (2a) penetrating the core insulating layer 2 and the metal foil (2c) are formed. The through holes (2a) are formed, for example, by irradiating laser such as $CO_2$ laser from the first surface (2F) side and/or the second surface (2B) side of the core insulating layer 2. It is also possible that the through holes (2a) are formed by drilling. The through holes (2a) may be formed using any formation method.

Next, the first plating film (2e) is formed on the entire surface of the metal foil (2c) on an opposite side with respect to the core insulating layer 2, on exposed end surfaces of the metal foil (2c) facing the through holes (2a), and on the inner walls of the through holes (2a). The first plating film (2e) is formed of, for example, the electroless plating film (2e1) and the electrolytic plating film (2e2). After the electroless plating film (2e1) formed of any metal such as copper or nickel is formed by electroless plating, the electrolytic plating film (2e2) is formed on the electroless plating film (2e1) by electrolytic plating using the electroless plating film (2e1) as a power feeding layer. It is also possible that, instead of the electroless plating film, a metal film such as a sputtering film formed by sputtering is formed. It is also possible that the first plating film (2e) is formed of a single-layer plating film. The first plating film (2e) having a desired thickness is formed.

By forming the first plating film (2e) on the end surfaces of the metal foil (2c) exposed in the through holes (2a) and on the inner walls of the through holes (2a), the through-hole conductors 3 are formed that have the hollow spaces (3a) at the centers thereof are formed of the first plating film (2e) in the through holes (2a). The metal foil (2c) and the first plating film (2e) are sequentially laminated on each of the first surface (2F) and the second surface (2B) of the core insulating layer 2.

As illustrated in FIG. 3C, the resin 4 is filled in the hollow spaces (3a) and solidified. When necessary, end surfaces of the solidified resin 4 are polished using any method such as chemical mechanical polishing. By the polishing, each of the end surfaces of the resin 4 is preferably flush with the surface of the first plating film (2e).

As illustrated in FIG. 3D, the second plating film (2f) is formed on the entire surfaces of the core insulating layer 2 on the first surface (2F) side and on the second surface (2B) side. Similar to the first plating film (2e), the second plating film (2f) may be formed of the electroless plating film (2f1) and the electrolytic plating film (2f2). For example, the electroless plating film (2f1) is formed on the entire surfaces of the core insulating layer 2 on the first surface (2F) side and on the second surface (2B) side, the electrolytic plating film (2f2) is formed on the electroless plating film (2f1) using the electroless plating film (2f1) as a power feeding layer, and the second plating film (2f) is formed of these two layers. As a result, the first conductor layer 11 and the second conductor layer 12 formed of the metal foil (2c), the first plating film (2e), and the second plating film (2f) are respectively formed on the first surface (2F) side and on the second surface (2B) side of the core insulating layer 2.

Figure 3E:
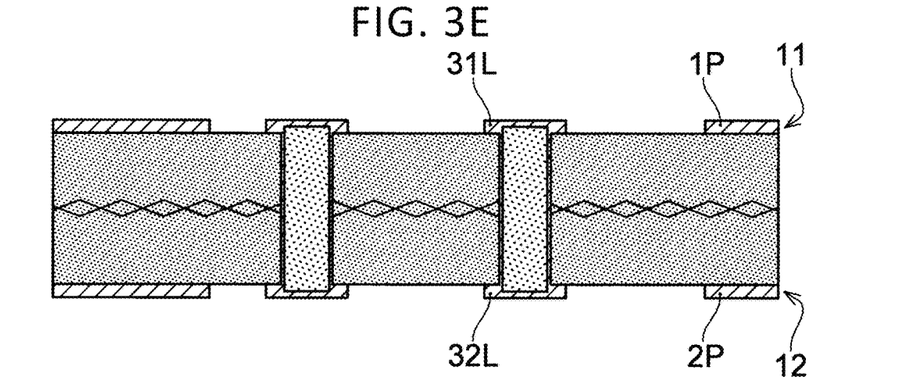
FIG. 3E is a cross-sectional view illustrating a method for manufacturing a method for manufacturing a wiring substrate according to an embodiment of the present invention.

As illustrated in FIG. 3E, the first conductor layer 11 and the second conductor layer 12 are patterned using a subtractive method. The first conductor layer 11 is formed to have patterns including the first land parts (31L) and the first plane parts (1P). The second conductor layer 12 is formed to have patterns including the second land parts (32L) and the second plane parts (2P).

Figure 3F:
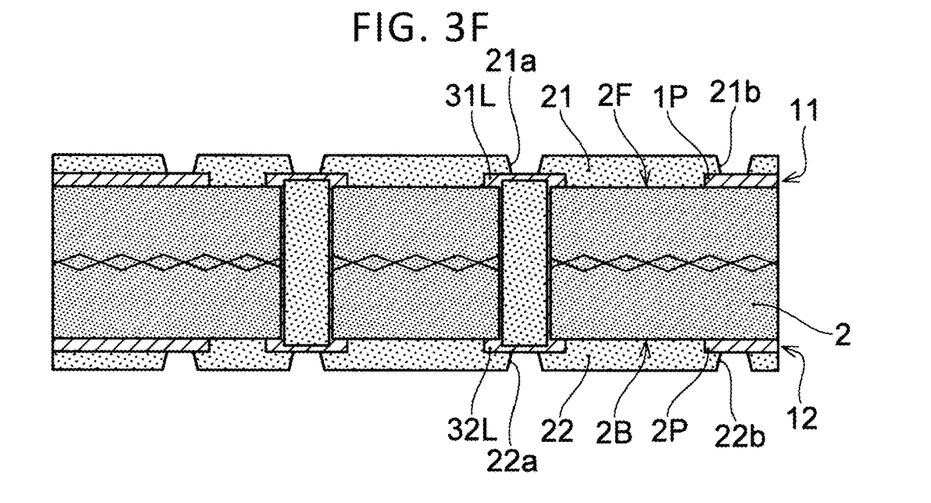
FIG. 3F is a cross-sectional view illustrating a method for manufacturing a method for manufacturing a wiring substrate according to an embodiment of the present invention.

As illustrated in FIG. 3F, the first insulating layer 21 is formed on the first surface (2F) side of the core insulating layer 2, and the second insulating layer 22 is formed on the second surface (2B) side of the core insulating layer 2. For example, on the first surface (2F) of the core insulating layer 2 and the first conductor layer 11, and on the second surface (2B) of the core insulating layer 2 and the second conductor layer 12, for example, a film-like epoxy resin is laminated, and heat and pressure are applied thereto. In the first insulating layer 21 and the second insulating layer 22, at positions where the via conductors are to be formed in these insulating layers, that is, on the land parts (31L, 32L) and on the plane parts (1P, 2P), through holes (21a, 21b) and through holes (22a, 22b) for forming the via conductors are respectively formed, for example, by irradiation with $CO_2$ laser.

Figure 3G:
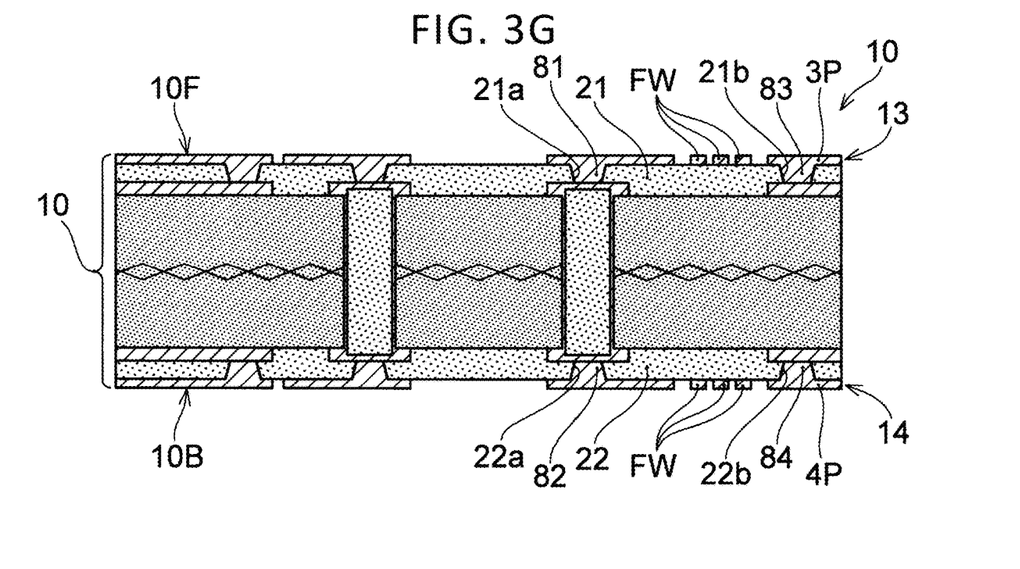
FIG. 3G is a cross-sectional view illustrating a method for manufacturing a method for manufacturing a wiring substrate according to an embodiment of the present invention.

As illustrated in FIG. 3G, the third conductor layer 13 and the fourth conductor layer 14 are formed. The third conductor layer 13 and the fourth conductor layer 14 are each formed, for example, using a semi-additive method. That is, a metal film is formed by electroless plating or sputtering on the surfaces of the first insulating layer 21 and the second insulating layer 22 and in the through holes (21a, 21b, 22a, 22b). A plating film is formed by pattern plating including electrolytic plating using the metal film as a power feeding layer. After that, unwanted portions of the metal film are removed, for example, by etching or the like. As a result, the third conductor layer 13 and the fourth conductor layer 14 each including predetermined conductor patterns are formed. The first via conductors 81 are formed in the through holes (21a), and the third via conductors 83 are formed in the through holes (21b). Further, the second via conductors 82 are formed in the through holes (22a), and the fourth via conductors 84 are formed in the through holes (22b). In the wiring substrate 1 of the embodiment, the third conductor layer 13 is patterned to include the fine wirings (FW) and the third plane parts (3P). The fourth conductor layer 14 is patterned to include the fine wirings (FW) and the fourth plane parts (4P). Formation of the core substrate 10 having the first surface (10F) and the second surface (10B) on an opposite side with respect to the first surface (10F) is completed.

Figure 3H:
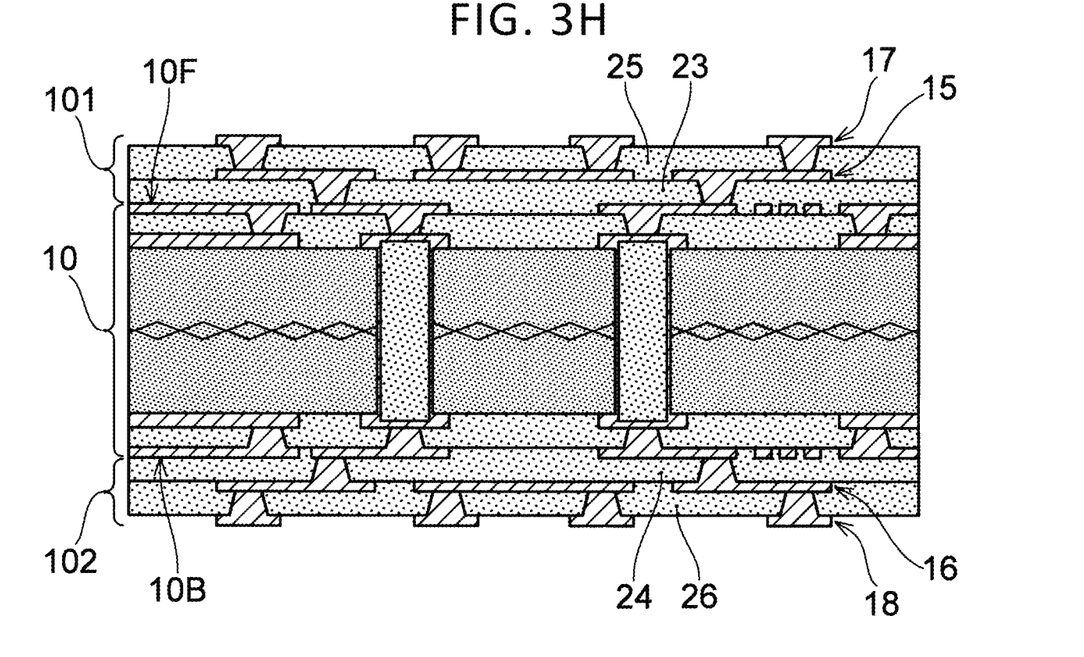
FIG. 3H is a cross-sectional view illustrating a method for manufacturing a method for manufacturing a wiring substrate according to an embodiment of the present invention.

As illustrated in FIG. 3H, the first build-up part 101 is formed on the first surface (10F) of the core substrate 10, and the second build-up part 102 is formed on the second surface (10B) of the core substrate 10. By repeating a method similar to that described with reference to FIGS. 3F and 3G, the insulating layers (the third insulating layer 23 and the fifth insulating layer 25) and the conductor layers (the fifth conductor layer 15 and the seventh conductor layer 17) are formed on an upper side of the first surface (10F) of the core substrate 10, and the insulating layers (the fourth insulating layer 24 and the sixth insulating layer 26) and the conductor layers (the sixth conductor layer 16 and the eighth conductor layer 18) are formed on an upper side of the second surface (10B) of the core substrate 10. The formation of the first build-up part 101 and the second build-up part 102 is completed.

Figure 3I:
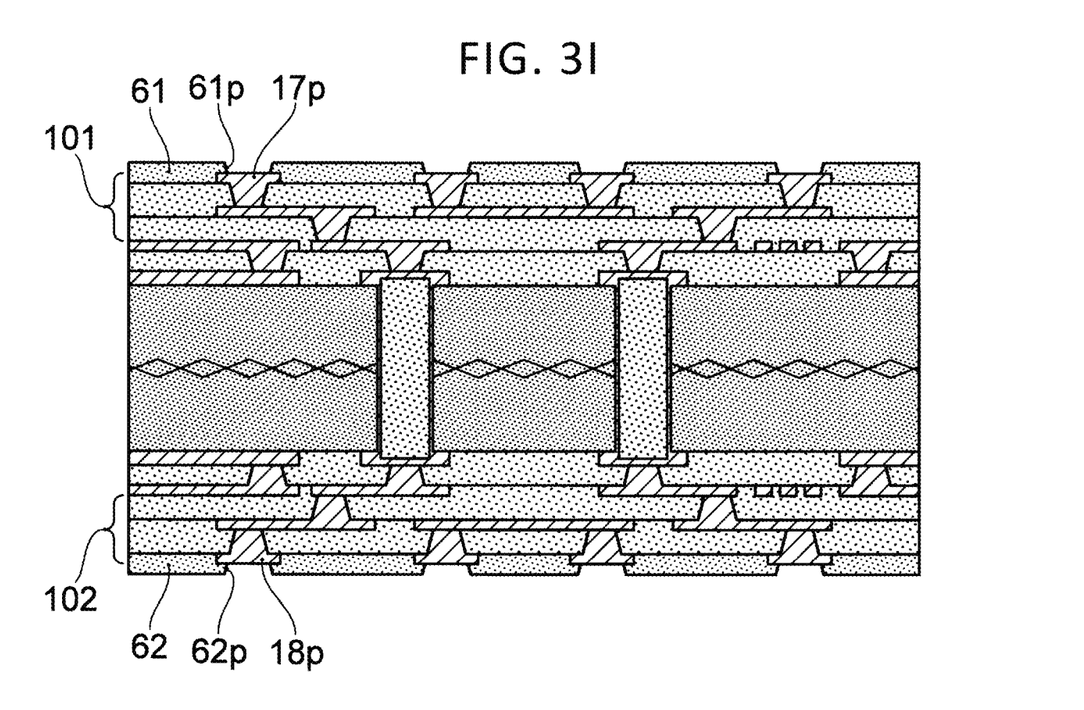
FIG. 3I is a cross-sectional view illustrating a method for manufacturing a method for manufacturing a wiring substrate according to an embodiment of the present invention.

As illustrated in FIG. 3I, the solder resist layer 61 is formed on the first build-up part 101, and the solder resist layer 62 is formed on the second build-up part 102. The solder resist layers (61, 62) are each formed, for example, by forming a resin layer containing a photosensitive epoxy resin or polyimide resin or the like, and performing exposure and development using a mask having appropriate opening patterns. The solder resist layers (61, 62) are formed so as to have the openings (61a, 62a) exposing the conductor pads (17p, 18p). Through the above processes, the wiring substrate 1 in the example of FIG. 1 is completed.

The wiring substrate of the embodiment is not limited to those having the structures illustrated in the drawings and those having the structures, shapes, and materials exemplified in the present specification. For example, the wiring substrate may have any number of insulating layers and any number of conductor layers on each of both sides of the core substrate, that is, in each of the first build-up part 101 and the second build-up part 102. The first build-up part 101 and the second build-up part 102 may have different numbers of insulating layers and different numbers of conductor layers.

Japanese Patent Application Laid-Open Publication No. 2005-203764 describes a multi-layer wiring substrate including a core substrate having a through hole part. On each of an upper surface and a lower surface of the core substrate, only a land portion of the through hole part, which includes a through-hole conductor provided on an inner wall surface of a through hole of the through hole part and a cured filler filling the through hole part, and a lid-like conductor that is in contact with the land portion and closes an opening part of the through hole part are formed.

In the multilayer wiring substrate described in Japanese Patent Application Laid-Open Publication No. 2005-203764, on each of the upper surface and the lower surface of the core substrate, a conductor layer is formed only in a region of the land portion of the through hole part. Therefore, warping or distortion in the core substrate is likely to occur in a process of forming a wiring layer on the core substrate, and a problem such as warping may occur even in a completed multilayer wiring substrate.

A wiring substrate according to an embodiment of the present invention includes a core substrate, the core substrate including: a core insulating layer that has a first surface and a second surface on an opposite side with respect to the first surface; a first conductor layer that is formed on the first surface and includes a first land part and a first plane part; a second conductor layer that is formed on the second surface and includes a second land part and a second plane part; a first insulating layer that covers the first surface and the first conductor layer; a second insulating layer that covers the second surface and the second conductor layer; a third conductor layer that is formed on the first insulating layer and includes fine wirings and a third plane part; and a fourth conductor layer that is formed on the second insulating layer and includes fine wirings and a fourth plane part. The first land part and the second land part are connected by a through-hole conductor formed on an inner side a through hole penetrating the core insulating layer. The first land part and the third conductor layer are connected by a first via conductor penetrating the first insulating layer. The second land part and the fourth conductor layer are connected by a second via conductor penetrating the second insulating layer. The first plane part and the third plane part are connected by a third via conductor penetrating the first insulating layer. The second plane part and the fourth plane part are connected by a fourth via conductor penetrating the second insulating layer. The first plane part and the third plane part are positioned at positions substantially overlapping with each other in a plan view and have substantially the same size. The second plane part and the fourth plane part are positioned at positions substantially overlapping with each other in a plan view and have substantially the same size.

According to an embodiment of the present invention, a wiring substrate including a core substrate with less warping is provided.

Obviously, numerous modifications and variations of the present invention are possible in light of the above teachings. It is therefore to be understood that within the scope of the appended claims, the invention may be practiced otherwise than as specifically described herein.

The invention claimed is:
1. A wiring substrate, comprising:
a core substrate comprising a core insulating layer, a first conductor layer formed on a first surface of the core insulating layer, a second conductor layer formed on a second surface of the core insulating layer on an opposite side with respect to the first surface, a first insulating layer formed on the first surface of the core insulating layer such that the first insulating layer is covering the first conductor layer, a second insulating layer formed on the second surface of the core insulating layer such that the second insulating layer is covering the second conductor layer, a third conductor layer formed on the first insulating layer, and a fourth conductor layer formed on the second insulating layer;
a first build-up part formed on the core substrate and comprising a third insulating layer formed on the third conductor layer of the core substrate and a fifth conductor layer formed on the third insulating layer such that the fifth conductor layer includes a fifth plane part positioned directly above the fine wirings in the third conductor layer and connected to the conductor pattern connected to the first land part in the third conductor layer; and
a second build-up part formed on the core substrate and comprising a fourth insulating layer formed on the fourth conductor layer of the core substrate and a sixth conductor layer formed on the fourth insulating layer such that the sixth conductor layer includes a sixth plane part positioned directly above the fine wirings in the fourth conductor layer and connected to the conductor pattern connected to the second land part in the fourth conductor layer,
wherein the first conductor layer includes a first land part and a first plane part, the second conductor layer includes a second land part and a second plane part, the third conductor layer includes a plurality of fine wirings and a third plane part such that the first and third plane parts are substantially overlapping with each other and have substantially a same size, the fourth conductor layer includes a plurality of fine wirings and a fourth plane part such that the second and fourth plane parts are substantially overlapping with each other and have substantially a same size, the core substrate includes a through-hole conductor formed through the core insulating layer and connecting the first land part and the second land part, a first via conductor formed through the first insulating layer and connecting the first land part and the third conductor layer, a second via conductor formed through the second insulating layer and connecting the second land part and the fourth conductor layer, a third via conductor formed through the first insulating layer and connecting the first plane part and the third plane part, and a fourth via conductor formed through the second insulating layer and connecting the second plane part and the fourth plane part, the fine wirings of the third conductor layer are formed between a conductor pattern connected to the first land part and the third plane part in the third conductor layer, the fine wirings of the fourth conductor layer are formed between a conductor pattern connected to the second land part and the fourth plane part in the fourth conductor layer, the first conductor layer includes a connection plane part connecting the first land part and the first plane part such that the connection plane part connected to the first land part is positioned directly below the fine wirings in the third conductor layer, and the second conductor layer includes a connection plane part connecting the second land part and the second plane part such that the connection plane part connected to the second land part is positioned directly below the fine wirings in the fourth conductor layer.

2. The wiring substrate according to claim 1, wherein the first conductor layer is consisting of the first land part and the first plane part, and the second conductor layer is consisting of the second land part and the second plane part.

3. The wiring substrate according to claim 2, wherein the fine wirings in the third conductor layer and/or the fourth conductor layer are a plurality of wirings configured to transmit signal.

4. The wiring substrate according to claim 2, wherein the fine wirings in the third conductor layer and/or the fourth conductor layer have a line width in a range of 8 µm to 30 µm, and an inter-wiring distance in a range of 10 µm to 30 µm.

5. The wiring substrate according to claim 2, wherein the fine wirings of the third conductor layer are formed between the fifth plane part connected to the first land part and the connection plane part connected to the first land part in a thickness direction of the wiring substrate and between the conductor pattern of the third conductor layer connected to the first land part and the third plane part connected to the first land part via the first plane part and the third via conductor, and the fine wirings of the fourth conductor layer are formed between the sixth plane part connected to the second land part and the connection plane part connected to the second land part in the thickness direction of the wiring substrate and between the conductor pattern of the fourth conductor layer connected to the second land part and the fourth plane part connected to the second land part via the second plane part and the fourth via conductor in a direction orthogonal to an extension direction of the fine wirings.

6. The wiring substrate according to claim 2, wherein the fine wirings in the third conductor layer and/or the fourth conductor layer are a plurality of wirings configured to transmit signal.

7. The wiring substrate according to claim 2, wherein the fine wirings in the third conductor layer and/or the fourth conductor layer have a line width in a range of 8 µm to 30 µm, and an inter-wiring distance in a range of 10 µm to 30 µm.

8. The wiring substrate according to claim 2, wherein the fine wirings in the third conductor layer and/or the fourth conductor layer have an aspect ratio in a range of 2.0 to 6.0.

9. The wiring substrate according to claim 1, wherein the fine wirings in the third conductor layer and/or the fourth conductor layer are a plurality of wirings configured to transmit signal.

10. The wiring substrate according to claim 9, wherein the fine wirings of the third conductor layer are formed between the fifth plane part connected to the first land part and the connection plane part connected to the first land part in a thickness direction of the wiring substrate and between the conductor pattern of the third conductor layer connected to the first land part and the third plane part connected to the first land part via the first plane part and the third via conductor, and the fine wirings of the fourth conductor layer are formed between the sixth plane part connected to the second land part and the connection plane part connected to the second land part in the thickness direction of the wiring substrate and between the conductor pattern of the fourth conductor layer connected to the second land part and the fourth plane part connected to the second land part via the second plane part and the fourth via conductor in a direction orthogonal to an extension direction of the fine wirings.

11. The wiring substrate according to claim 9, wherein the fine wirings in the third conductor layer and/or the fourth conductor layer have a line width in a range of 8 µm to 30 µm, and an inter-wiring distance in a range of 10 µm to 30 µm.

12. The wiring substrate according to claim 9, wherein the fine wirings in the third conductor layer and/or the fourth conductor layer have an aspect ratio in a range of 2.0 to 6.0.

13. The wiring substrate according to claim 1, wherein the fine wirings in the third conductor layer and/or the fourth conductor layer have a line width in a range of 8 µm to 30 µm, and an inter-wiring distance in a range of 10 µm to 30 µm.

14. The wiring substrate according to claim 13, wherein the fine wirings in the third conductor layer and/or the fourth conductor layer have an aspect ratio in a range of 2.0 to 6.0.

15. The wiring substrate according to claim 13, wherein the fine wirings in the third conductor layer and the fourth conductor layer have an aspect ratio in a range of 2.0 to 6.0.

16. The wiring substrate according to claim 1, wherein the fine wirings of the third conductor layer are formed between the fifth plane part connected to the first land part and the connection plane part connected to the first land part in a thickness direction of the wiring substrate and between the conductor pattern of the third conductor layer connected to the first land part and the third plane part connected to the first land part via the first plane part and the third via conductor, and the fine wirings of the fourth conductor layer are formed between the sixth plane part connected to the second land part and the connection plane part connected to the second land part in the thickness direction of the wiring substrate and between the conductor pattern of the fourth conductor layer connected to the second land part and the fourth plane part connected to the second land part via the second plane part and the fourth via conductor in a direction orthogonal to an extension direction of the fine wirings.

17. The wiring substrate according to claim 1, wherein the fine wirings in the third conductor layer have a line width in a range of 8 µm to 30 µm, and an inter-wiring distance in a range of 10 µm to 30 µm.

18. The wiring substrate according to claim 1, wherein the fine wirings in the fourth conductor layer have a line width in a range of 8 µm to 30 µm, and an inter-wiring distance in a range of 10 µm to 30 µm.

19. The wiring substrate according to claim 1, wherein the fine wirings in the third conductor layer and the fourth conductor layer have a line width in a range of 8 µm to 30 µm, and an inter-wiring distance in a range of 10 µm to 30 µm.

20. The wiring substrate according to claim 1, wherein the fine wirings in the third conductor layer and/or the fourth conductor layer have an aspect ratio in a range of 2.0 to 6.0.

* * * * *